LOGIC CIRCUIT

Filed Jan. 26, 1962 3 Sheets-Sheet 1

INVENTOR
THOMAS MICHAEL LO CASALE

BY J. Donald Weber, Jr.
AGENT

Feb. 8, 1966 T. M. LO CASALE 3,234,399

LOGIC CIRCUIT

Filed Jan. 26, 1962 3 Sheets-Sheet 2

Feb. 8, 1966 T. M. LO CASALE 3,234,399

LOGIC CIRCUIT

Filed Jan. 26, 1962 3 Sheets-Sheet 3

3,234,399

LOGIC CIRCUIT

Thomas M. Lo Casale, Warminster, Pa., assignor to Sperry Rand Corporation, New York, N.Y., a corporation of Delaware Filed Jan. 26, 1962, Ser. No. 168,942
3 Claims. (Cl. 307—88.5)

This invention relates to a logic circuit which may be used as a building block for a logic system. More particularly, this invention relates to a high speed NOR logic circuit which utilizes tunnel diodes for the active elements thereof.

Many uses for logic circuits are well-known in the art. For example, in the construction of computing machines, and the like, logic circuits are used abundantly. The trend in these devices is to fabricate logic circuits which may be thought of as modular in form or of such a nature that they may be packaged to be modular and, also, to have higher operating speeds with less stringent tolerance requirements. The advent of the tunnel diode has provided an active element which may be utilized to perform these functions. That is, tunnel diode circuitry may be designed so that a logic function may be performed and which circuit may be used repetitively whereby logic building blocks (or modular type of circuitry) may be provided. Moreover, it is well known that tunnel diodes are high speed operating devices that can be used in logic circuits. The circuit tolerances which are laid down and applied to tunnel diode circuits may be relaxed in certain cases according to both the particular logic function which is to be performed by the tunnel diode circuits and the type of circuit in which the tunnel diode is connected. That is, certain circuit configurations are known to require less stringent tolerances of the components and parameters than other circuit configurations.

One type of logic circuit which is desirable and advantageous in the construction of computing machines is the logical NOR circuit. Certain circuit configurations for providing logical NOR circuits using tunnel diodes utilize transformer coupling between various stages of the circuit. Previously, these transformer coupled tunnel diode logic circuits utilized a variable primary impedance to determine the value of secondary current. This circuit configuration has certain disadvantages as for example time delays caused by current flow through a transformer winding or signal amplitude problems created by the potential drop exhibited across the transformer coil. The circuit which comprises the instant invention provides a transformer coupled NOR circuit which obviates these disadvantages. This circuit differs from previous tunnel diode NOR circuits which are transformer coupled in that it uses a variable secondary transformer impedance to gate a clock current. That is, the input signal which may be applied to a particular circuit is supplied to the secondary winding of a transformer. The tunnel diode switching element is connected in parallel with the primary winding of the transformer. In accordance with the input signal applied to the secondary of the transformer, a clock signal may pass through either the primary winding of the transformer or the tunnel diode. The path chosen by the current is determinative of whether or not the tunnel diode will be switched from one operating condition, for example the low voltage condition, to the other operating condition or the high level voltage condition. The output signals from the circuit are derived from one electrode of the tunnel diode and are therefore determined by the presence or absence of input signals.

One object of this invention is to provide a high speed tunnel diode logic circuit.

Another object of this invention is to provide a high speed tunnel diode NOR logic circuit which has wider parameter tolerances for given fan-in and fan-out factors.

Another object of this invention is to provide a high speed tunnel diode circuit which utilizes the gating of a constant current clock with the operating state of a previous stage to provide NOR logic operations.

Another object of this invention is to provide a tunnel diode logic circuit which has DC isolation between the stages thereof.

Another object of this invention is to provide a transformer coupled logic circuit using tunnel diodes.

Another object of this invention is to provide a transformer coupled, tunnel diode circuit which performs the NOR logic function.

These and other objects and advantages of this invention will become more readily apparent subsequent to a study of the following description in conjunction with the drawings attached hereto, in which.

Figure 1A:
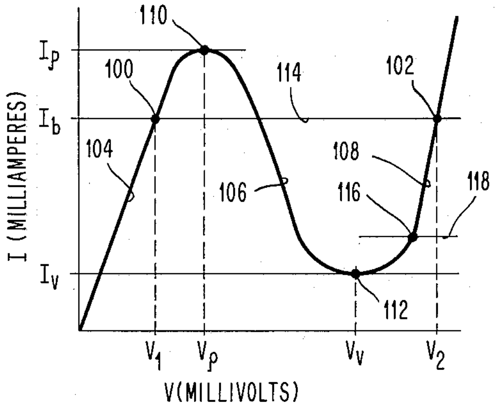
FIGURES 1A and 1B represent typical V–I characteristics for the semi-conductor components shown in the circuit.

Referring now to FIGURE 1A, there is shown a V–I characteristic for a typical tunnel diode such as may be used in the circuit described subsequently. This V–I characteristic comprises the conventional operating regions. That is, the low voltage operating region is designated by reference numeral 104; region 108 is the high voltage operating condition; and region 106 is the negative resistance portion of the operating characteristic of a tunnel diode. It is to be understood, of course, that the region 106 in actuality may be consnidered to be non-existent, but for clarity and in accordance with conventional descriptions, this region is included in the diagram. The regions, are, in effect, separated by the peak point 110 and the valley point 112. The peak point is defined as the point between the low voltage operating region and the negative resistance operation region and determines the peak current $I_P$ and the peak voltage $V_P$. The valley point 112 separates the negative resistance region 106 and the high voltage operating condition 108 and defines the valley current $I_V$ and the valley voltage $V_V$. The load line 114 intersects the V–I characteristic in both the low and the high voltage operating regions.

The operating point 100 which represents the intersection of the load line 114 and the low voltage region 104 of the V–I characteristic is defined by the bias current $I_B$ which is supplied to the tunnel diode. It should be understood that in the circuit described infra $I_B$ should be relatively near the $I_P$ in value. As a typical magnitude, $I_B$ may be $0.7I_P$. The operating point 100 defines the low voltage operating potential $V_1$.

The high level operating point 102 represents the intersection of the load line 114 and the high voltage region 108 of the V–I characteristic. As shown, operating point 102 is defined by the steady-state current supplied by the bias source and thereby defines the high voltage operating potential $V_2$. It should be noted that the current $I_B$ is shown to be the constant current at operating point 100 and 102. In actuality, this current may not be exactly constant. However, by properly choosing the bias potential sources and the impedances associated therewith, the current supplied to the tunnel diodes may exhibit a negligible drop between the high and low voltage operating conditions. Line 118 is shown to illustrate the load line when load current is drawn from the tunnel diode. This load line intersects the high voltage region 108 and provides the operating point 116. It is to be understood, of course, that the tunnel diode can supply output circuits so long as the output current drawn thereby lies between operating points 102 and 112 on the V–I characteristic; otherwise, the tunnel diode will switch automatically to the low voltage operating condition. (It is to be understood, of course, that there may be desired modes of operation wherein the automatic reset may be advantageous. However, in the conventional usage of this type of circuit, the non-resetting operation is preferred.)

Figure 1B:
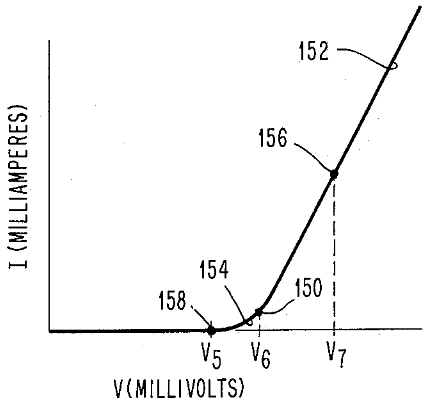

Referring now to the FIGURE 1B, there is shown a typical V–I characteristic for a diode which may be utilized in the circuit described infra. This characteristic comprises the conventional low conduction region 154 and the high conduction region 152. These relative conduction regions are effectively separated by the breakpoint 150 which represents the knee of the curve beyond which the operating conditions are different in each direction. The operating points 156 and 158 are shown in the high and low conductance regions respectively.

Figure 2A:
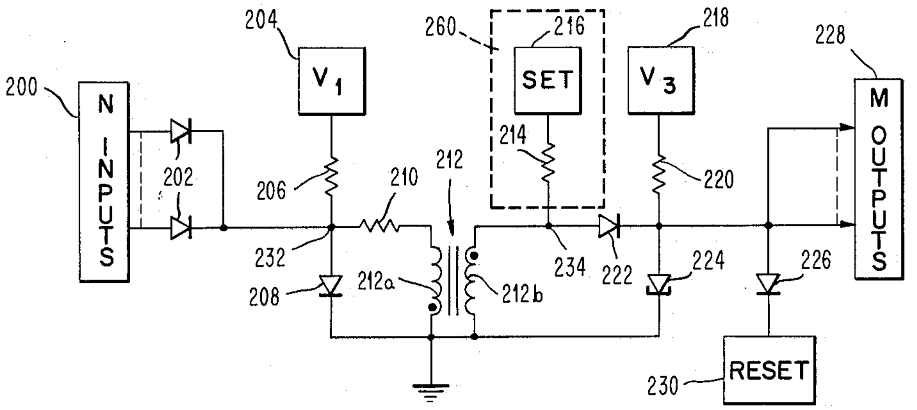
FIGURE 2A is a schematic drawing of one embodiment of this invention.

Referring now to FIGURE 2A, there is shown a schematic diagram of one embodiment of the circuit which is the subject of this invention. In this circuit, all parameter values are exemplary only and illustrative of the preferred embodiment of the invention. Furthermore, all components are assumed to be ideal unless otherwise specified. All potentials enumerated are evaluated with respect to ground. Input signals to the circuit are supplied by input source 200. Input source 200 is shown as a single source. However, it is to be understood that this source may be representative of a plurality of input sources which may, for example, comprise circuits similar to that shown in this figure. In the particular embodiment discussed, input source 200 is connected to the anodes of input diodes 202 where diodes 202 are preferred non-linear impedance input coupling networks. The cathodes of the input diodes 202 are connected to common junction 232. There are two input diodes 202 shown which may be for example Microwave Associates type D4121 diodes. However, it is to be understood N inputs are available and are contemplated for use with the circuit. Thus, N input diodes 202 may be connected, in parallel to junction 232.

Resistor 206 which may be 2000 ohms for example has one terminal thereof connected to common junction 232. Another terminal of resistor 206 is connected to potential source 204 which is capable of providing approximately +25 volts. Also connected to common junction 232 is the anode of diode 208 which diode may also be a Microwave Associates type D4121 diode. The cathode of diode 208 is connected to ground. In parallel with diode 208 is the combination of resistor 210 and the primary winding 212*a* of transformer 212. Thus, resistor 210 which may be on the order of 20 ohms has one terminal thereof connected to common junction 232. Another terminal of resistor 210 is connected to one end of the primary winding 212*a* of transformer 212. The other terminal of primary winding 212*a* is connected to ground. The transformer 212 may be for example a Ferroxcube 4A Bead transformer having 1:1 ratio where each winding includes two turns. The secondary winding 212*b* of the transformer 212 has one terminal thereof connected to ground. Another terminal of winding 212 is connected to one terminal of resistor 214. Resistor 214 which may be on the order of 10,000 ohms has another terminal thereof connected to potential source 216 which may provide a set clock signal which varies between 0 and +10 volts. In particular, the normal base line voltage supplied by the set clock potential source 216 is ground potential and the set clock pulse has a magnitude of about +10 volts. Any conventional type of pulse forming network can be used to supply the set clock signal. The common junction 234 between primary winding 212*b* and resistor 214 is also connected to the anode of diode 222. This diode may also be the D4121 type diode previously discussed. The cathode of the diode is connected to the anode of tunnel diode 224. The tunnel diode may be, for example, an RCA type IN3128 tunnel diode. It is to be understood, of course, that for different current requirements needed by the circuit, a different tunnel diode may be utilized. The cathode of the tunnel diode is returned to ground. Also connected to the anode of tunnel diode 224 is one terminal of resistor 220 which may be on the order of 5,000 ohms. Another terminal of resistor 220 is connected to potential source 218 which may supply about +20 volts. The anode of reset diode 226 which may be, for example, a Hughes HD–5000 type diode is connected to the anode of tunnel diode 224. The cathode of diode 226 is returned to the reset source 230. Reset source 230 normally supplies a ground potential but also supplies a periodic pulse of about −1 volt. The silicon diode has a relatively high threshold or breakpoint whereby diode 226 does not conduct when the tunnel diode 224 is in the high voltage condition. The output source 228 is also connected to the anode of 224. As in the case of input 200, output 228 is representative of one or more output utilizing circuits. Thus, it is shown that M output devices may derive signals from the circuit. The limitation on the valve of M is, of course, the output load capability of the tunnel diode 224.

Figure 2B:
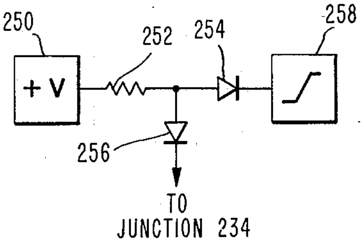
FIGURE 2B is a schematic drawing of a clocking arrangement which may be used with the circuit shown in FIGURE 2A.

Referring now to FIGURE 2B, there is shown a variation which may be utilized in conjunction with the circuit shown on FIGURE 2A. This variation regards the network portion inclosed within the dashed lines 260 in FIGURE 2A. Thus, instead of utilizing a clock source which supplies a large magnitude pulsating signal, a clock arrangement may be utilized wherein a large clock current may be controlled by a very small pulsating clock voltage. Thus, for example, the cathode of diode 256 may be connected to the common junction 234 between primary winding 212*b* and diode 222 as shown in FIGURE 2A. The anode of diode 256 is connected to resistor 252 which may be on the order of 10,000 ohms and which has another terminal thereof connected to potential source 250. The potential source 250 may be a substantially D.C. supply which provides about +10 volts. Also, the anode of diode 256 is connected to the anode of diode 254. The cathode of diode 254 is connected to a conventional pulsating source 258 which produces a base line potential about ground potential and a high level pulse output on the order of +1 volt. The diode 256 may be a Hughes silicon diode for example, type HD–5000. The diode 254 may be a Microwave Associates germanium diode type D4121. The distinction between these types of diodes will be shown in that the breakpoint voltage for the germanium diode 254 is substantially lower than the breakpoint voltage for the silicon diode 256. That is, when the potential source 258 is at ground potential, diode 254 will be forward biased. Consequently, all the current supplied by source 250 and resistor 252 will flow through diode 254 to potential source 258. Diode 256, because of the requirement of a relatively high forward voltage drop thereacross, is effectively zero biased and substantially no current flows therethrough. In the alternative, however, when the potential supplied by source 258 switches to the +1 volt level, the diode 254 is back-biased and the low impedance current path is effectively removed from the circuit. Consequently, the entire current is supplied by source 250 and resistor 252 to the remainder of the circuit via diode 256.

The clocking arrangement shown in FIGURE 2B is meant to illustrate the fact that variations to the circuit configuration shown in FIGURE 2A are contemplated and are feasible. That is, these variations may be made to the circuit without altering the operation thereof and within the inventive concepts described.

Figure 3:
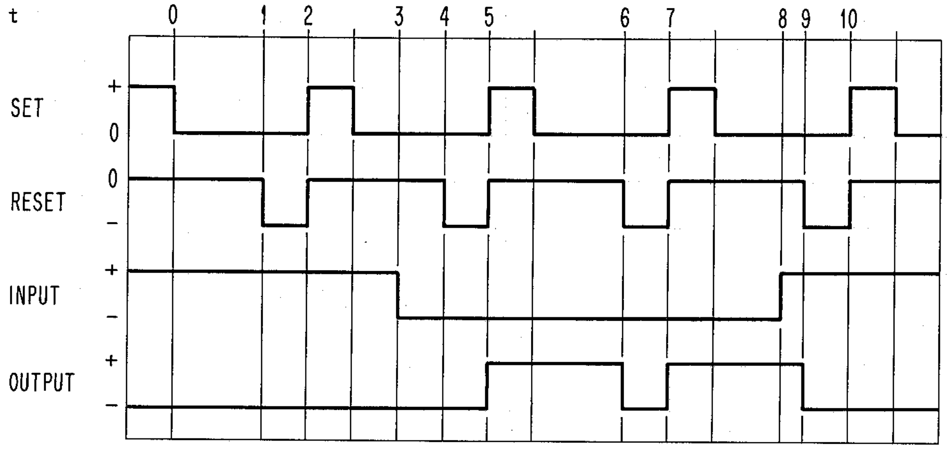
FIGURE 3 shows an idealized timing diagram for the embodiment shown in FIGURE 2A.

Referring now to FIGURE 3, there is shown the timing diagram for the operation of the circuit shown in FIGURE 2A. The waveforms shown in FIGURE 3 are idealized. That is, the waveforms shown in FIGURE 3 incorporate the effect of instantaneous rise times as suggested by the vertical leading and trailing edges of the pulses. Moreover, the output signals are shown as being produced simultaneously with the application of appropriate set signals. The circuit shown in FIGURE 2A operates in accordance with the waveforms shown in FIGURE 3. Thus, it is initially assumed that the tunnel diode 224 has been reset to the low voltage operating condition. Consequently, the potential exhibited at the anode thereof is on the order of +50 millivolts. Inasmuch as diode 226 is a silicon diode having a relatively high breakpoint potential, this output signal is applied to the output device 228 and is represented in FIGURE 3 as the low level or minus signal. (It is to be understood, of course, that a minus symbol is used to designate a low level signal, and not necessarily to designate a minus potential.) The tunnel diode 224 is effectively biased to the current $I_B$ on the order of 3 to 4 milliamperes. That is, potential source 218 supplies approximately +20 volts via resistor 220 which is on the order of 5,000 ohms. These parameters produce a current flow of approximately 4 milliamps. The current flows through tunnel diode 224 inasmuch as diode 222 is back-biased and diode 226 is effectively biased to the high impedance portion of its characteristic even though forward biased. Furthermore, common junction 232 is biased to approximately +250 millivolts. The potential of approximately +250 millivolts will become more readily apparent in the description of the embodiments shown in FIGURE 4, but the potential may be understood to be approximately one half the tunnel diode valley voltage when a tunnel diode is assumed to provide the input signal to the input stage. The potential at junction 232 may be defined in terms of the voltage divider network comprising resistor 206 (2,000 ohms), resistor 210 (20 ohms) and the potential of +25 volts supplied by source 204. Assuming that in the steady state condition the secondary winding 212*a* has negligible resistance, the potential of approximately +250 millivolts at junction 232 is obtained. It will be determined that the potential +250 millivolts at junction 232 is effective to bias diode 208 at about the breakpoint potential of its characteristic. At time period T0, the arbitrary input signal shown in FIGURE 3 and applied by source 200 is a high level signal. It is to be understood, that as in the case of the output signal, an input signal may be a high or a low level. The high level is indicated by a + and the low level indicated by a − symbol. These symbols are not necessarily indicative of the polarity of the potential applied by the input source 200. Actually, the particular potentials suggested are a high level signal of +500 millivolts and a low level signal of +50 millivolts. The application of the +500 millivolt signal to the anode of input diodes 202 effectively biases the input diode to the breakpoint potential thereof. Thus, these diodes are capable of becoming low impedance paths with the application of a more positive potential to the anode thereof or a more negative potential to the cathode thereof.

The application of the high level input signals provides a certain amount of forward current flow through the circuit. This current is applied to junction 232. If the current was to flow to ground via resistor 210 and secondary winding 212*a*, a time delay would be encountered. This time delay may be computed in accordance with the usual formula which is $L/R$. For the type of transformer described, the value of L will be on the order of two microhenries. The value of the resistance was previously defined as on the order of 20 ohms. The utilization of the $L/R$ formula will show that the time constant for this network will be on the order of 100 nanoseconds. In tunnel diode logic circuits this time delay is relatively long. That is, the remainder of the circuit should not function until at least 100 nanoseconds after the application of an input circuit thereto and tunnel diode circuitry now operates on the order of nanoseconds only. Consequently, diode 208 is connected in parallel with the RL network. Thus, any current which flows though input diodes 202 to junction 232 will flow to ground via diode 208. Thus, diode 208 effects a type of speed-up function in the circuit. At time period T1, a reset signal is applied to tunnel diode 224 via diode 226 and reset source 230. Inasmuch as the tunnel diode 224 was previously in its low voltage operating condition, the tunnel diode remains therein and the output signal remains in the low level or +50 millivolt signal. At time period T2, a set clock signal is applied to the circuit. This set clock signal is a positive going signal and is supplied by either of the alternative clock sources discussed supra and enclosed within dashed lines 260. In any event, a positive going signal is applied to the anode of diode 222 and one terminal of primary winding 212*b*. This set signal is the signal which determines the switching or not of tunnel diode 224. That is, when the positive signal is applied to the anode of diode 222 and one terminal of primary winding 212*b*, the current will flow in the direction of the least impedance. Thus, the operating impedance of the primary windings 212*b* must be determined.

It is well-known in transformer theory that approximations for an ideal transformer may be made wherein the impedance of the primary winding may be designated as $a^2R_s$ where $a^2$ is the turns ratio and $R_s$ is the series impedance of the secondary circuit. It has been previously defined that the turns ratio is 1:1 wherein $a=1$. Consequently, the reflected impedance of the secondary appears as merely $R_s$. To determine the value of $R_s$, the operation of the transformer 212 is to be understood. Thus, in accordance with the "dot convention" the application of a positive signal at the marked terminal of primary winding 212*b* produces a positive potential at the dotted terminal of secondary winding 212*a*. Clearly, this positive potential at the dotted terminal 212*a* inherently suggests that the undotted terminal exhibits a relatively negative potential. Therefore, there is current flow through resistor 210 which tends to lower the potential at junction 232 whereby current is required to be drawn through diode 202 inasmuch as resistor 206 is a high impedance and the resistor and potential source 204 comprise a substantially constant current source. When diode 202 is forward biased, the impedance of the secondary winding 212*a* appears to be low impedance so that current can flow therethrough. In the alternative, however, if diode 202 is effectively back-biased by the application of a low level input signal to the anode thereof, the secondary winding appears as a high level impedance (approximately an open circuit). In the latter case, primary 212*b* appears to be a very high impedance and current supplied by bias source 216 via resistor 214 is passed via 222 to tunnel diode 224.

In the case shown in time period T2 of FIGURE 3, the input signal supplied via source 200 is a high level input signal at the time when the set clock signal is applied. Thus, the impedance of winding 212*b* appears as a low impedance to signal passing therethrough to ground. Consequently, no change is made in the output signals applied by tunnel diode 224 to the output device 228. At time period T3, it is seen that the arbitrary input signal supplied to the circuit by source 200 switches from the high level signal (+500 millivolts) to the low level signal (+50 millivolts). Thus, diodes 202 are back-biased inasmuch as the anodes thereof are at +50 millivolts and the cathodes thereof are at +250 millivolts. At time period T4, another reset signal is applied to the circuit. Since tunnel diode 224 was not switched to the high level voltage operating condition, the tunnel diode condition is not reset or changed and the output signal remains the same as before. At time period T5 a set clock signal is supplied by the clock source. Because the impedance of winding 212*b* is represented by a high impedance, the current supplied by the clock source passes through diode 222 to tunnel diode 224. The application of the current to tunnel diode 224 via diode 222 is sufficient to switch the tunnel diode from the low voltage condition to the high voltage condition. That is, the application of a signal of about 10 volts magnitude across the resistance 214, which has been designated as about 10,000 ohms, produces a current signal which is sufficient to drive the tunnel diode 224 past the peak point 100. When the tunnel diode switches to the high voltage operating condition, the potential at the anode thereof switches to approximately +500 millivolts. This signal is applied to the output device 228. Thus, as shown in FIGURE 3, the output signal switches from the low (+50 millivolts) to the high (+500 millivolts) signal. The output signal remains at the high level until the application of the next reset clock signal via source 230. This negative going reset signal is on the order of −1 volt and is sufficient to render diode 226 conductive so that sufficient current passes therethrough to permit tunnel diode 224 to be switched to the low level operating condition. Thus, the output signal switches from +500 to +50 millivolts at time period T6.

At time period T7, a further set clock signal is applied via resistor 214 by set clock source 216. This set clock signal is applied in conjunction with a low level input signal at the anode of input diode 202. Again, winding 212*b* represents a high impedance to the current pulse applied by the set clock source whereby the current passes through diode 222 to tunnel diode 224. Again the passage of this current signal through tunnel diode 224 is sufficient to switch the tunnel diode to the high level operating condition. Thus, the output signal supplied by the circuit switches to the +500 millivolt level at time period T7. The output signal applied to output device 228 remains at the high level output until the application of the next reset signal which is applied at time period T9. At this time the output signal switches to the low level potential.

It should be noted that the arbitrary input signal supplied by input source 200 via input diode 202 is switched to the high level at time period T8. Therefore, when the set clock signal is applied at T10 by source 216 via resistor 214, the winding 212*b* represents a low impedance and current flows therethrough to ground thereby bypassing tunnel diode 224 such that the tunnel diode is not switched to the high level operating condition. Consequently, the output signal remains at the low level and is not switched to the high level.

Thus, it may be seen that the circuit shown in FIGURE 2A provides NOR logic operation inasmuch as the application of a high level input signal causes the production of a low level output signal. Likewise, the application of a low level input signal results in the production of a high level input signal results in the production of a high level output signal. As noted supra, modifications may be made in the component values, as well as in the circuit configuration without altering the inventive concepts described.

Figure 4:
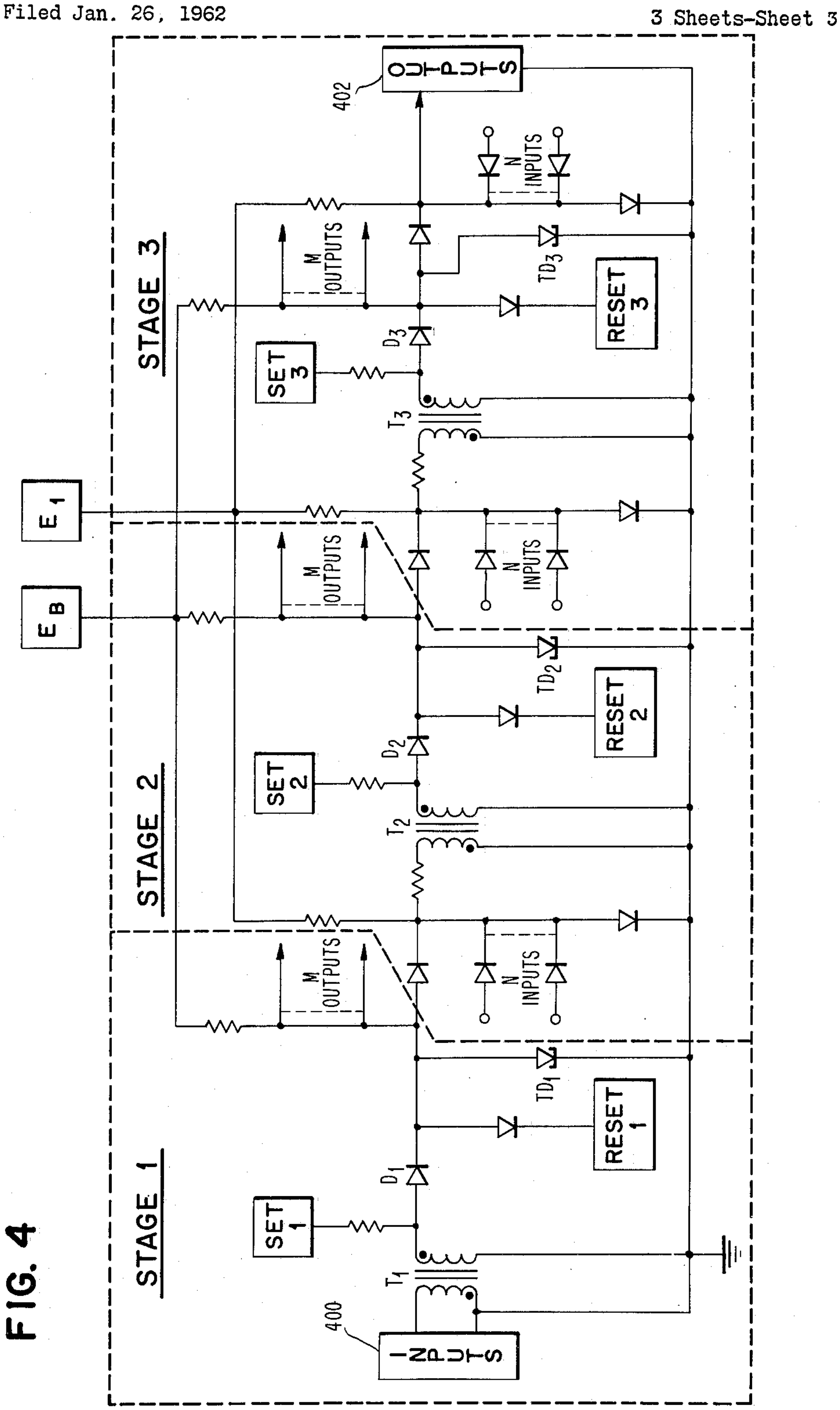
FIGURE 4 shows a schematic diagram of a three-stage network using the circuit which is the subject of this invention.

Referring now to FIGURE 4, there is shown another embodiment of this invention. In this embodiment of the invention, there are shown three stages of logic network. Each of these stages is identical to the circuit shown in FIGURE 2A. Moreover, each of the stages shown in FIGURE 4 operates identically to the stage or circuit shown in FIGURE 2A.

Figure 5:
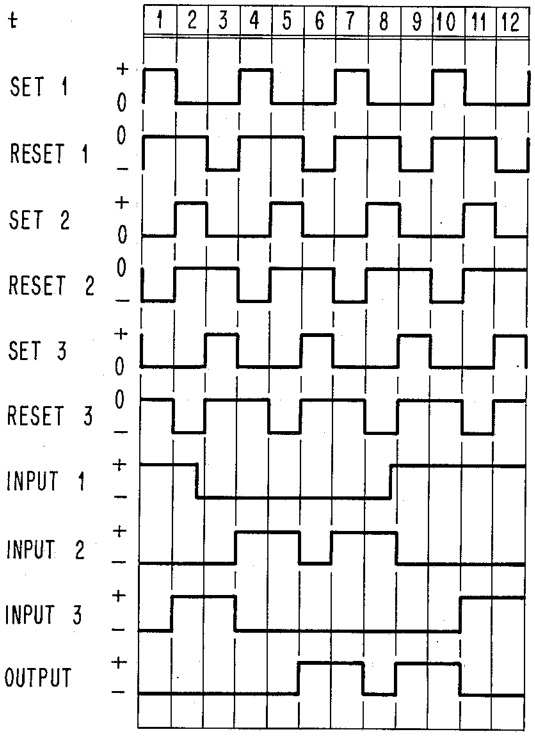
FIGURE 5 is a timing diagram for the circuit shown in FIGURE 4.

The operation of the embodiment shown in FIGURE 4 is readily understandable when described in terms of the timing diagram shown in FIGURE 5. In FIGURE 5, the set and reset clock signals for each stage are shown. The set signals are shown as positive going signals which normally have a zero or ground potential base line and a positive pulse. Similarly, the reset clock signals are shown as normally having a ground potential base line and a negative potential signal. The signal labeled Input 1 is an arbitrary input signal applied to input source 400 and is applied to stage 1. The Input 2 signal is the signal which is applied to the input of stage 2, and more particularly is the output signal supplied by stage 1. Consequently, the Input 2 signal is identical to the output signal supplied by stage 1. Similarly, the Input 3 signal is the input signal applied to stage 3 by stage 2 and is, therefore, identical to the output signal supplied by stage 2. The output signal is the signal supplied by stage 3 to output device 402 and is the output signal for the over-all circuit.

Again, the signals shown in FIGURE 5 are idealized signals as described in regard with the signals shown in FIGURE 3. It is to be understood also, that the particular timing diagram shown in FIGURE 5 is not meant to be limitative of the invention but rather is an illustrative example of the operation of the circuit shown in FIGURE 4. That is, the relative arrangements of the set and reset signals of the several stages need not be specifically as shown. Other modifications and combinations of the set and reset signals are contemplated within the inventive concepts of this device. In reference to the description of the operation of the circuit, it is assumed that each of the tunnel diodes in each of the stages are initially reset to the low voltage operating condition.

The Input 1 signal (an arbitrary input signal supplied to the network) is shown as a high level signal during time period T1. This signal is shown to switch to a low level signal during time period T2. The signal is shown to switch in the duration of time period T2 inasmuch as a general description is desired and the application of an input signal at the precise clocking times is not absolutely required by the input signal. The Input 1 signal remains a low level signal until time period T8 when the input signal switches to the high level. Again, the signal switch occurs during the duration of a time period and not at the precise clocking time in order to provide generality to the circuit description. As discussed supra, the stage 1 tunnel diode is initially assumed to be set to the low voltage operating condition whereby the output therefrom (Input 2) is a low level signal. The application of the Set 1 signal at time period T1 is in conjunction with a high level input signal and, therefore, as described supra with relation to the circuit of FIGURE 2, the current signal supplied by Set 1 flows to ground via the primary winding of transformer T1. Consequently, the tunnel diode TD1 is not switched to the high voltage condition. Therefore, the application of the Reset 1 signal at time period T3 has no effect on the output signal supplied by stage 1. The application of the Set 1 signal at time period T4 is applied in conjunction with a low level Input 1 signal. Consequently, transformer T1 presents a high impedance in the circuit and current flows via diode D1 to tunnel diode TD1 thereby switching the tunnel diode to the high voltage operating condition such that the output from the circuit switches to the high level. The output from stage 1 remains at the high level until reset by the succeeding Reset 1 signal shown at time period T6. This Reset 1 signal causes the output signal to switch to the low level. At time period T7, the next clock or set signal is supplied to stage 1 in conjunction with 1 low level input signal. Once again, this Set 1 signal creates current flow through diode D1 and tunnel diode TD1 such that the tunnel diode is switched to the high voltage operating condition. The output signal supplied by the circuit is, therefore, a high level signal and remains such until reset by the next succeeding Reset 1 signal. This Reset 1 signal is applied at time period T9 and effects a switching in the output signal from the high to the low level. Inasmuch as the next Set 1 signal is applied to stage 1 at time period T10 in conjunction with a high level Input 1 signal, the current produced by the Set 1 signal passes through the primary winding of transformer T1 to ground by-passing tunnel diode TD1 such that the output signal from the stage remains at the low level.

The application of the Input 2 signal to stage 2 results in the output signal which is labeled as Input 3. The application of the Reset 2 signal at time period T1 assures that the tunnel diode TD2 is in the low voltage operating condition. The Set 2 signal at time period T2 is applied in conjunction with a low level Input 2 signal whereupon the primary winding of transformer T2 represents a high impedance. Thus, the current produced by the Set 2 signal passes through diode D2 and tunnel diode TD2 thereby switching the tunnel diode to the high level operating condition and producing a high level output signal from stage 2. This high level output signal continues until the Reset 2 signal applied at time period T4 switches tunnel diode TD2 back to low level operating condition whereby the output signal attains the low level. The Set 2 signals supplied at time periods T5 and T8 are supplied in conjunction with high level Input 2 signals. Thus, the current signal produced flows through the primary winding of transformer T2 to ground thereby bypassing tunnel diode TD2 and effecting no change in the output signal produced by stage 3. At time period T11 the Set 2 signal is applied to stage 2 in conjunction with a low level Input 2 signal such that current flows through tunnel diode TD2. This current flow switches the tunnel diode to the high voltage operating condition whereby a high level output signal is produced.

The signal labeled Input 3 is applied to stage 3 and the signal labaleled output is the output signal applied to output device 402 by stage 3. The Reset 3 signal applied at time period T2 assures that the output from stage 3 will be a low level output inasmuch as the tunnel diode TD3 has been reset to the low voltage operating condition. The Set 3 signal applied at time period T3 is applied in conjunction with a high level input signal whereby current flows through the primary winding of transformer T3 and the output signal from stage 3 remains a low level signal. At time period T6, a Set 3 signal is applied to stage 3 in conjunction with a low level Input 3 signal. This signal causes current flow through TD3 such that the tunnel diode is switched to the high voltage operating condition and the high level output signal is produced by stage 3. This high level output signal remains such until the application of a Reset 3 signal at time period T8. Thus, the output signal switches to the low level signal at time period T8. At time period T9, another Set 3 signal is applied in conjunction with a low level Input 3 signal whereby tunnel diode TD3 is switched to a high level output condition and a high level output signal is produced. The high level output signal exists until the application of the next Reset 3 signal at time period T11 when the output signal is switched to the low level signal.

Thus, it has been shown that each of the individual circuits in the network comprising stages 1 to 3 operate as NOR logic circuits. The individual circuit operation was described in more detail in relation to FIGURE 2A. Moreover, it has been shown that a plurality of NOR circuits as described in FIGURE 2A may be cascaded together to form a logic network.

Modifications or variations of the precise configurations and clocking arrangements shown may be suggested to those skilled in the art. These modifications and variations which do not materially alter the inventive concepts and teachings of the instant invention are meant to be included within the scope of the appended claims.

Having thus described the invention what is claimed is:

1. A logic circuit comprising, a tunnel diode, first bias means connected to said tunnel diode for biasing said tunnel diode for bistable operation, said tunnel diode normally operating in one of its stable states of operation, source means for supplying periodic current pulses, said source means diode coupled to said tunnel diode, a first winding connected to said source means and said tunnel diode, said current pulses supplied by said source means being applied to said tunnel diode for changing the operating state thereof only when the impedance of said first winding is relatively high, input signal supplying means, second bias means, coupling diode means connected between said input signal supplying means and said second bias means, said second bias means effective to supply a bias to said coupling diode means such that said coupling diode means is capable of forward current conduction only when an input signal is supplied by said input signal supplying means, a second winding connected in series with said coupling diode means such that current conduction through said second winding is enabled only when said coupling diode is capable of forward current conduction, said first and second windings being inductively coupled such that the current conduction capability of said second winding directly affects the current conduction capability of said first winding such that impedance of said first winding is relatively high only when said second winding is incapable of current conduction, and a shunt diode connected in parallel with said second winding, said shunt diode providing a high speed switching network for said coupling diodes and further providing a non-linear impedance shunt path across said second winding.

2. The logic circuit recited in claim 1 wherein said second bias means includes a voltage divider network connected in series with said second winding, said coupling diode means and said shunt diode connected to said voltage divider network.

3. A logic circuit comprising input means, said input means including a unilaterally conducting diode providing a high speed switching network for said input means, a transformer, a first winding of said transformer connected to said input means, bias means connected to said first transformer winding and to said input means to control the reflected impedance of said transformer in accordance with the signal provided by said input means, said bias means including a voltage divider network connected to said diode to provide a predetermined threshold potential thereat such that said diode is conductive only in response to a predetermined input signal, a tunnel diode which is biased for bistable operation, a second winding of said transformer connected to said tunnel diode, means for applying current pulses, said current pulse applying means connected to said second winding and to said tunnel diode such that a current pulse is selectively applied to said tunnel diode when the impedance of said transformer is relatively large and to said second winding when the impedance of said transformer is relatively low, said tunnel diode being normally biased to the low voltage stable state until switched to the high voltage stable state by the application of a current pulse thereto.

References Cited by the Examiner

UNITED STATES PATENTS

| | | | |
|---|---|---|---|
| 2,782,404 | 2/1957 | Bergman | 340—149 X |
| 3,040,186 | 6/1962 | Duzer | 307—88.5 |
| 3,089,961 | 5/1963 | Overn et al. | 307—88.5 |
| 3,119,935 | 1/1964 | Samusenko | 307—88.5 |

OTHER REFERENCES

International Solid State Chts Conf. Digest of Tech. Papers, article by Lewin, "Application of Tunnel Diodes," Feb. 10, 1960, pages 10 and 11.

IRE Transactions on Electronic Computers, Esaki Diode High-Speed Logical Circuits, by Goto et al., pages 25–29, March 1960.

"RCA TN No. 438," January 1961, 3 shts. by Amedei et al. entitled Tunnel Diode Logic Circuits for Electron Data Prec. Systems.

"Tunnel Diode Logic Circuits," by Chow Electronics, June 24, 1960, pages 103–107.

ARTHUR GAUSS, *Primary Examiner.*